United States Patent
Yan (10) Patent No.: US 9,978,976 B2
(45) Date of Patent: May 22, 2018

(54) ARRAY SUBSTRATE, METHOD FOR PRODUCING THE SAME AND DISPLAY APPARATUS

(71) Applicant: BOE Technology Group Co., Ltd., Beijing (CN)

(72) Inventor: Guang Yan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/021,736

(22) PCT Filed: Aug. 6, 2015

(86) PCT No.: PCT/CN2015/086229
§ 371 (c)(1),
(2) Date: Mar. 14, 2016

(87) PCT Pub. No.: WO2016/123943
PCT Pub. Date: Aug. 11, 2016

(65) Prior Publication Data
US 2017/0012230 A1      Jan. 12, 2017

(30) Foreign Application Priority Data
Feb. 6, 2015   (CN) .......................... 2015 1 0065282

(51) Int. Cl.
*H01L 51/50*      (2006.01)
*H01L 51/00*      (2006.01)
*H01L 27/32*      (2006.01)

(52) U.S. Cl.
CPC ........ *H01L 51/504* (2013.01); *H01L 27/3213* (2013.01); *H01L 51/0011* (2013.01);
(Continued)

(58) Field of Classification Search
CPC .......................... H01L 27/3211; H01L 51/5278
See application file for complete search history.

(56) References Cited

U.S. PATENT DOCUMENTS

| 6,016,033 A | 1/2000 | Jones et al. |
| 8,575,603 B2 | 11/2013 | Chu et al. |

(Continued)

FOREIGN PATENT DOCUMENTS

| CN | 102386208 A | 3/2012 |
| CN | 102593150 A | 7/2012 |

(Continued)

OTHER PUBLICATIONS

International Search Report and Written Opinion for International Application No. PCT/CN2015/086229, dated Nov. 11, 2015, 9 pages.

(Continued)

*Primary Examiner* — Fernando L Toledo
*Assistant Examiner* — Valerie N Newton
(74) *Attorney, Agent, or Firm* — Westman, Champlin & Koehler, P.A.

(57) ABSTRACT

Embodiments of the present disclosure provide an array substrate, a method for producing the same and a display apparatus. The array substrate includes a base substrate; and first to fourth light emitting units provided on the base substrate and arranged periodically thereon. Each light emitting unit of the first to fourth light emitting units includes a first electrode, a second electrode and an organic material function layer, and the organic material function layer comprises a light emitting portion. The light emitting portion includes a first light emitting layer within the second and third light emitting units, a second light emitting layer within the first and second light emitting units, and a third light emitting layer within the third and fourth light emitting units. The first light emitting layer is configured to emit light within at least one of the second and third light emitting units.

18 Claims, 2 Drawing Sheets

(52) U.S. Cl.
CPC ...... *H01L 51/5004* (2013.01); *H01L 51/5044* (2013.01); *H01L 27/322* (2013.01)

(56) References Cited

U.S. PATENT DOCUMENTS

| | | | |
|---|---|---|---|
| 8,716,929 | B2 | 5/2014 | Yoo et al. |
| 8,946,735 | B2 | 2/2015 | Lee et al. |
| 2002/0011785 | A1 | 1/2002 | Tang et al. |
| 2010/0090241 | A1 | 4/2010 | D'Andrade et al. |
| 2014/0183480 | A1 | 7/2014 | Lee et al. |
| 2016/0268351 | A1* | 9/2016 | Wu .................... H01L 27/3209 |

FOREIGN PATENT DOCUMENTS

| | | | |
|---|---|---|---|
| CN | 103050630 | A | 4/2013 |
| CN | 103915471 | A | 7/2014 |
| CN | 103943658 | A | 7/2014 |
| CN | 104617231 | A | 5/2015 |

OTHER PUBLICATIONS

English translation of Box No. V of the Written Opinion of the International Searching Authority for International Application No. PCT/CN2015/086229, 2 pages.
First Office Action, including Search Report, for Chinese Patent Application No. 201510065282.8, dated May 30, 2016, 15 pages.
Rejection Decision for Chinese Patent Application No. 201510065282.8, dated Nov. 1, 2016, 18 pages.
Second Office Action for Chinese Patent Application No. 201510065282.8, dated Aug. 8, 2016, 16 pages.

* cited by examiner

ARRAY SUBSTRATE, METHOD FOR PRODUCING THE SAME AND DISPLAY APPARATUS

CROSS-REFERENCE TO RELATED APPLICATION

This application is a Section 371 National Stage Application of International Application No. PCT/CN20151/086229, filed on Aug. 6, 2015, entitled "Array Substrate, Method for Producing the Same and Display Apparatus", which has not yet published, and which claims priority to Chinese Application No. 201510065282.8, filed on Feb. 6, 2015, incorporated herein by reference in their entirety.

BACKGROUND OF THE INVENTION

Field of the Invention

The present invention relates to a display field, more particular to an array substrate, a method for producing the same and a display apparatus.

Description of the Related Art

Due to having self-illumination, all solid state, wide viewing angle, rapid response or the similar advantages, OLED is considered to have tremendous application prospect in the display of Flat Panel, as a new generation of flat panel display product after LCD and PDP.

Currently, the method for producing the OLED display device is to manufacture a light emitting layer of RGB sub-pixel with Fine Metal Mask (FMM) by an evaporation deposition, so that a resolution of the produced OLED display device is limited to the size precision of metal mask pattern.

SUMMARY OF THE INVENTION

The technical problem to be solved by the present disclosure is how to solve the defect that the resolution of the produced OLED display device in the prior art is limited to the size precision of metal mask pattern.

In accordance with one aspect of the present invention, it provides an array substrate, comprising:

a base substrate; and a first light emitting unit, a second light emitting unit, a third light emitting unit, and a fourth light emitting unit provided on the base substrate and arranged periodically thereon, wherein each of the first light emitting unit, the second light emitting unit, the third light emitting unit and the fourth light emitting unit comprises a first electrode, a second electrode and an organic material function layer, the organic material function layer comprising a light emitting portion, wherein the light emitting portion comprises a first light emitting layer in the second light emitting unit and the third light emitting unit, a second light emitting layer in the first light emitting unit and the second light emitting unit, and a third light emitting layer in the third light emitting unit and the fourth light emitting unit, and wherein the first light emitting layer is configured to emit light within at least one of the second light emitting unit and the third light emitting unit.

In one example, the first light emitting layer extends across the second light emitting unit and the third light emitting unit, and a part of the second light emitting layer in the second light emitting unit is overlaid on the first light emitting layer, and a part of the third light emitting layer in the third light emitting unit is overlaid on the first light emitting layer.

In one example, the second light emitting layer and the third light emitting layer are provided to contact with each other at a boundary between the second light emitting unit and the third light emitting unit.

In one example, all the first light emitting layer, the second light emitting layer and the third light emitting layer have a first width, a width of the first light emitting layer in the second light emitting unit and the third light emitting unit is a second width, a width of the second light emitting layer in the first light emitting unit and the second light emitting unit is the second width, and a width of the third light emitting layer in the third light emitting unit and the fourth light emitting unit is the second width, wherein the second width is a half of the first width.

In one example, the second light emitting unit is configured to make only one of the first light emitting layer and the second light emitting layer located therein emit light, and the third light emitting unit is configured to make only one of the first light emitting layer and the third light emitting layer located therein emit light.

In one example, the only one of the first light emitting layer and the second light emitting layer is made to emit light by controlling carrier transmission characteristics of the first light emitting layer and the second light emitting layer in the second light emitting unit and/or relationship of energy level between them;

the only one of the first light emitting layer and the third light emitting layer is made to emit light by controlling carrier transmission characteristics of the first light emitting layer and the third light emitting layer in the third light emitting unit and/or relationship of energy level between them.

In one example, the carrier transmission characteristics of the second light emitting layer and the third light emitting layer are configured to be beneficial to electron hole transmission, so that only the first light emitting layer in the second light emitting unit and the third light emitting unit emits light.

In one example, when the first electrode is a cathode and the second electrode is an anode, HOMO of the second light emitting layer and the third light emitting layer is controlled to be identical with or very close to that of the first light emitting layer, and LUMO of the second light emitting layer and the third light emitting layer is controlled to have large difference from that of the first light emitting layer, so that only the first light emitting layer in the second light emitting unit and the third light emitting unit emits light.

In one example, the second light emitting unit also includes a barrier layer between the first light emitting layer and the second light emitting layer, which is configured in the second light emitting unit to prevent electrons or electron holes injected into one of the first and second light emitting layers from being injected into the other one; and/or the third light emitting unit also includes a barrier layer between the first light emitting layer and the third light emitting layer, which is configured in the third light emitting unit to prevent electrons or electron holes injected into one of the first and third light emitting layers from being injected into the other one.

In one example, the barrier layer in the second and third light emitting units is a common barrier layer.

In one example, the common barrier layer is configured to enable the first light emitting layer to emit light in both the second light emitting unit and the third light emitting unit, and a color conversion layer is provided at a light exiting side of the second light emitting unit or the third light emitting unit.

In one example, the light emitting colors of the first, second and third light emitting layers each are any one of green, dark blue and light blue, and they are different from each other, and the color conversion layer is used to convert the green, dark blue or light blue into red.

In one example, the light emitting color of the first light emitting layer is green, the light emitting color of one of the second light emitting layer and the third light emitting layer is dark blue and that of the other is light blue.

In one example, when the second light emitting layer emits light in both the first and second light emitting units, a color conversion layer is provided at a light exiting side of one of the first and second light emitting units; or when the first light emitting layer emits light in both the second and third light emitting units, a color conversion layer is provided at a light exiting side of one of the second and third light emitting units; or when the third light emitting layer emits light in both the third and fourth light emitting units, a color conversion layer is provided at a light exiting side of one of the third and fourth light emitting units.

In one example, one of the first electrode and the second electrode is an anode, while the other one is a cathode.

In one example, the organic material function layer further comprises an electron hole function layer between the corresponding light emitting layer and the anode and an electron function layer between the corresponding light emitting layer and the cathode.

In one example, at least one of the first electrode and the second electrode is a transparent electrode, and the color conversion layer is provided at a side of the transparent electrode or the base substrate away from the corresponding light emitting layer.

In one example, one of the first and second electrodes is provided to be in a form of a plurality of electrodes separated from each other, and the other one is provided to be a common electrode.

In accordance with another aspect of the present invention, it provides a display device, comprising an array substrate as described above.

In accordance with yet further aspect of the present invention, it provides a method for producing the array substrate as described above, comprising the following of:

forming the first electrode at a position of the base substrate corresponding to the first to fourth light emitting units;

forming the first light emitting layer at a position of the base substrate formed with the first electrode, corresponding to the second light emitting unit and the third light emitting unit;

forming the second light emitting layer at a position of the base substrate formed with the first light emitting layer, corresponding to the first light emitting unit and the second light emitting unit, wherein a part of the second light emitting layer in the second light emitting unit is overlaid on the first light emitting layer;

forming the third light emitting layer at a position of the base substrate formed with the second light emitting layer, corresponding to the third light emitting unit and the fourth light emitting unit, wherein a part of the third light emitting layer in the third light emitting unit is overlaid on the first light emitting layer;

forming the second electrode at a position of the base substrate formed with the third light emitting layer, corresponding to the first to fourth light emitting units.

In the embodiments of the present invention, the first light emitting layer is disposed in the second light emitting unit and the third light emitting unit, the second light emitting layer is disposed in the first light emitting unit and the second light emitting unit, the third light emitting layer is disposed in the third light emitting unit and the fourth light emitting unit, and only one light emitting layer in the second light emitting unit and the third light emitting unit is configured to emit light, and the color conversion layer is disposed at the light exiting side, so that the array substrate can emit light with four colors, and upon manufacturing the light emitting layer of the OLED display device, the display product having higher resolution can be manufactured without replacing the Fine Metal Mask.

DETAINED DESCRIPTION OF PREFERRED EMBODIMENTS OF THE INVENTION

The specific embodiments of the present invention are described in detail below in conjunction with the drawings and the embodiments thereof. The following embodiments are only used to explain the present invention, but not to limit the scope of the present invention.

Figure 1:
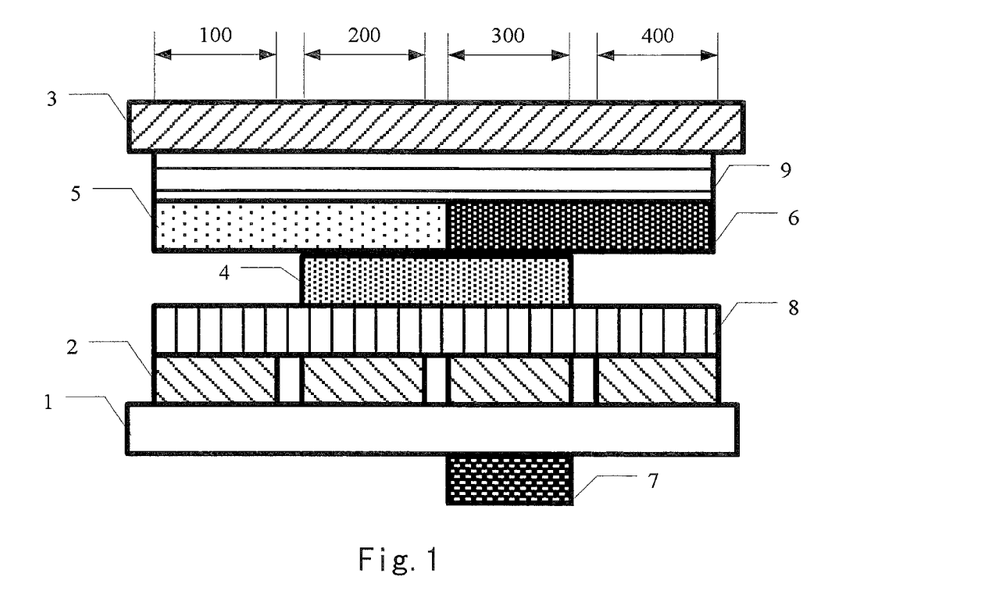
FIG. 1 is a schematic view of an array substrate in accordance with a first embodiment of the present invention.

FIG. 1 shows a schematic view of an array substrate in accordance with a first embodiment of the present invention. The array substrate includes a base substrate 1, and a first light emitting unit 100, a second light emitting unit 200, a third light emitting unit 300 and a fourth light emitting unit 400 provided on the base substrate 1 and arranged periodically. Each of the first to fourth light emitting units 100, 200, 300, 400 includes a first electrode 2, a second electrode 3 and an organic material function layer. The organic material function layer includes a light emitting portion. The light emitting portion includes a first light emitting layer 4 within the second light emitting unit 200 and the third light emitting unit 300, a second light emitting layer 5 within the first light emitting unit 100 and the second light emitting unit 200, and a third light emitting layer 6 within the third light emitting unit 300 and the fourth light emitting unit 400.

Specifically, as shown in FIG. 1, the first light emitting layer 4 is disposed below the second light emitting layer 5 and the third light emitting layer 6, for example, in the second light emitting unit 200, the second light emitting layer 5 is overlaid on the first light emitting layer 4, and in the third light emitting unit 300, the third light emitting layer 6 is overlaid on the first light emitting layer 4. Alternatively, the first light emitting layer 4 can be provided above the second light emitting layer 5 and the third light emitting layer 6.

The first light emitting unit 100 includes a left part of the second light emitting layer 5 which is not overlaid on the first light emitting layer 4 (i.e., only having one light emitting layer); the second light emitting unit 200 includes parts of the first light emitting layer 4 and the second light emitting layer 5 stacked with each other (i.e., having two light emitting layers); the third light emitting unit 300 includes parts of the first light emitting layer 4 and the third light emitting layer 6 stacked with each other (i.e., having two light emitting layers); and the fourth light emitting unit 400 includes a right part of the third light emitting layer 6 which is not overlaid on the first light emitting layer 4 (i.e., only having one light emitting layer). The first light emitting layer 4 extends over (regions of) the second light emitting unit 200 and the third light emitting unit 300. In one example, the second light emitting layer 5 and the third light emitting layer 6 are disposed to contact each other at boundaries between the second light emitting unit 200 and the third light emitting unit 300.

In addition, in the second light emitting unit 200, the first light emitting layer 4 is fully overlapped with the second light emitting layer 5 and only one light emitting layer of them can emit light therein; in the third light emitting unit 300, the first light emitting layer 4 is fully overlapped with the third light emitting layer 6 and only one light emitting layer of them can emit light therein, but in this case the first light emitting layer 4 in at least one of the second light emitting unit 200 and the third light emitting unit 300 emits light.

One light emitting unit of the two light emitting units which have the same light emitting layer (the same first light emitting layer, the same second light emitting layer, or the same third light emitting layer) can emit light, further includes a color conversion layer 7 at a light exiting side. For example, if the second light emitting layer 5 is used to emit light in both the first light emitting unit 100 and the second light emitting unit 200, then the color conversion layer 7 is located at the light exiting side of the first light emitting unit 100 or the second light emitting unit 200. If the first light emitting layer 4 is used to emit light in both the second light emitting unit 200 and the third light emitting unit 300, then the color conversion layer 7 is located at the light exiting side of the second light emitting unit 200 or the third light emitting unit 300. If the third light emitting layer 6 is used to emit light in both the third light emitting unit 300 and the fourth emitting unit 400, then the color conversion layer 7 is located at the light exiting side of the third light emitting unit 300 or the fourth light emitting unit 400. The light exiting side of each light emitting unit is the side where the light emitted from the light emitting layer can exit. For example, as for the array substrate as shown in FIG. 1, the light emitted from the light emitting layer in the third light emitting unit 300 exits from the base substrate 1 after passing the first electrode 2, then the color conversion layer 7 may be disposed at the side of the first electrode 2 apart away from the light emitting layer. Preferably, the light conversion layer 7 may be disposed at the side of the base substrate 1 apart away from the light emitting layer.

In the array substrate of the first embodiment of the present invention, the first light emitting layer 4 is disposed in the second light emitting unit 200 and the third light emitting unit 300, the second light emitting layer 5 is disposed in the first light emitting unit 100 and the second light emitting unit 200, the third light emitting layer 6 is disposed in the third light emitting unit 300 and the fourth light emitting unit 400, and one of the first and second light emitting layers 4, 5 in the second light emitting unit 200 and one of the first and third light emitting layers 4, 6 in the third light emitting unit 300 are configured to emit light, and the color conversion layer 7 is disposed at the light exiting side, so that the array substrate can emit light with four colors, and upon manufacturing the light emitting layer of the OLED display device, the display product having higher resolution can be manufactured without replacing the Fine Metal Mask.

Please be noted that as shown in FIG. 1, the second light emitting layer 5 and the third light emitting layer 6 are located at the same layer, and the first light emitting layer 4 is located below the layer where they are located. This is only one example, however, the person skilled in the art can specifically set the relative positional relationship of the first, second and third light emitting layers 4, 5, 6 as actually required, for example, they can be disposed on different layers and spaced apart from each other by the transparent insulation layer.

In addition, in the above described array substrate, the first electrode is an anode, but also can be a cathode. The present invention does not make any specific limitation on this. If the first electrode is the anode, then the second electrode is the cathode; otherwise, if the first electrode is the cathode, then the second electrode is the anode.

Figure 2:
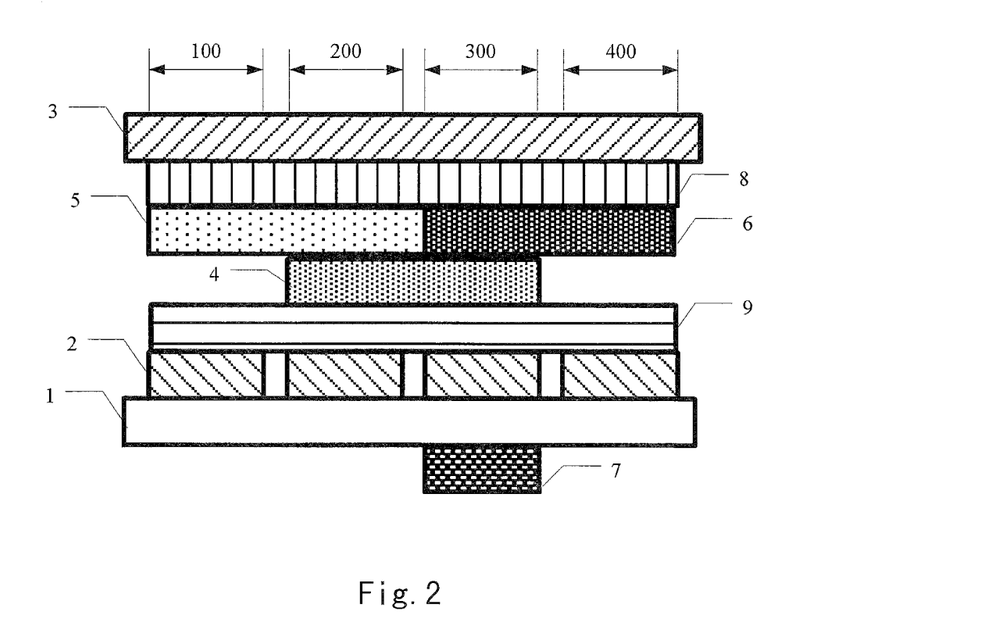
FIG. 2 is a schematic view of an array substrate in accordance with a second embodiment of the present invention.

In the present embodiment, the organic material function layer is used to enable the respective light emitting units to emit light. Besides the light emitting layer, it also can include an electron function layer 9 and an electron hole function layer 8, wherein the electron function layer includes at least one of an electron transmission layer and an electron injection layer, and the electron hole function layer includes at least one of an electron hole transmission layer and an electron hole injection layer. The electron hole function layer 8 is disposed between the anode and the light emitting layer, and the electron function layer 9 is disposed between the cathode and the light emitting layer. For example, when the first electrode 2 is the anode, the second electrode 3 is the cathode, as shown in FIG. 1. When the first electrode 2 is the cathode, the second electrode 3 is the anode, as shown in FIG. 2.

Figure 3:
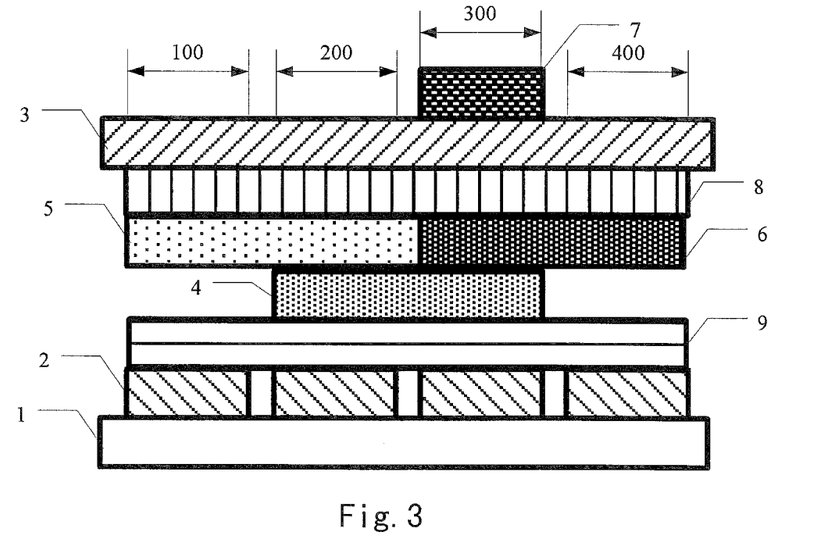
FIG. 3 is a schematic view of an array substrate in accordance with a third embodiment of the present invention.

Furthermore, in the present embodiment, at least one of the first electrode 2 and the second electrode 3 is a transparent electrode, and the color conversion layer 7 is disposed at the side of the transparent electrode away from the light emitting layer. For example, when the first electrode 2 is made of transparent materials and the second electrode 3 is made of opaque materials, the light emitted from the light emitting layer exits from the first electrode 2, and thus the color conversion layer 7 is disposed at the side of the first electrode 2 away from the light emitting layer as shown in FIG. 1. When the first electrode 2 is made of opaque materials, and the second electrode 3 is made of transparent materials, the light emitted from the light emitting layer exits from the second electrode 3, and thus the color conversion layer 7 is disposed at the side of the second electrode 3 away from the light emitting layer as shown in FIG. 3. When the first electrode 2 and the second electrode 3 both are made of transparent materials (i.e., double-sided display), the light emitted from the light emitting layer can exit from both the first electrode 2 and the second electrode 3, and thus the color conversion layer 7 is disposed at the side of the first electrode 2 and the second electrode 3 away from the light emitting layer.

Please be noted that one of the first electrode 2 and the second electrode 3 can be disposed to be in a form of a plurality of separate small electrodes, while the other one is disposed to be a common electrode. In other words, as shown in FIG. 1, the first electrode 2 is composed of a plurality of separate electrodes, while the second electrode 3 is composed of an electrode having an area for covering the first to fourth light emitting units 100, 200, 300, 400. It should be understood that the arrangement of the electrodes as shown in FIG. 1 is only one example, whereas the person skilled in the art can specifically dispose the forms of the first electrode 2 and the second electrode 3 as actually required.

In the present embodiment, in order to enable only one light emitting layer of the second light emitting unit 200 and the third light emitting unit 300 to emit light, this can be achieved by controlling carrier transmission characteristics of two light emitting layers in the second light emitting unit 200 and the third light emitting unit 300 and/or energy level relationship between them so that the electron holes of the anode or the electrons of the cathode cannot arrive at the corresponding light emitting layer therein.

For example, for the array substrate as shown in FIG. 2, in the case that the first electrode 2 is a cathode and the second electrode 3 is an anode, this can make the carrier transmission characteristics of the second light emitting layer 5 and the third light emitting layer 6 be beneficial to the electron hole transmission, while in the second light emitting unit 200 and the third light emitting unit 300, the electron holes of the second electrode 3 do not or rarely stay in the second light emitting layer 5 and the third light emitting layer 6, but to flow in the first light emitting layer 4 and meet the electrons of the first electrode 2 within the first light emitting layer 4 to make it to emit light; due to no or few electron holes emitting light, the second light emitting layer 5 and the third light emitting layer 6 do not emit light, so that only the first light emitting layer 4 within the second light emitting unit 200 and the third light emitting unit 300 can emit light.

Further, the only one light emitting layer for emitting light can be obtained by the energy level design between the two light emitting layers of the light emitting units. For example, as for the array substrate shown in FIG. 2, when the first electrode 2 is the cathode and the second electrode 3 is the anode, HOMO (Highest Occupied Molecular Orbital) energy levels of the second light emitting layer 5 and the third light emitting layer 6 can be controlled to be the same to or very close to that of the first light emitting layer 4. Further, in the second light emitting unit 200 and the third light emitting unit 300, the electron holes of the second electrode 3 do not or rarely stay in the second light emitting layer 5 and the third light emitting layer 6, but to flow into the first light emitting layer 4. At the same time, the LUMO (Lowest Unoccupied Molecular Orbital) energy levels of the second light emitting layer 5 and the third light emitting layer 6 are designed to have a large difference from that of the first light emitting layer 4, so that the electrons of the first electrode 2 substantially stay within the first light emitting layer 4 so that only the first light emitting layer 4 within the second light emitting unit 200 and the third light emitting unit 300 can emit light.

Except the above methods, it is also possible to dispose a barrier layer between the two different light emitting layers in the second light emitting unit 200 and the third light emitting unit 300, which is used within the same light emitting unit to prevent the electrons or electron holes injected into one light emitting layer from being injected into the other light emitting layer.

Figure 4:
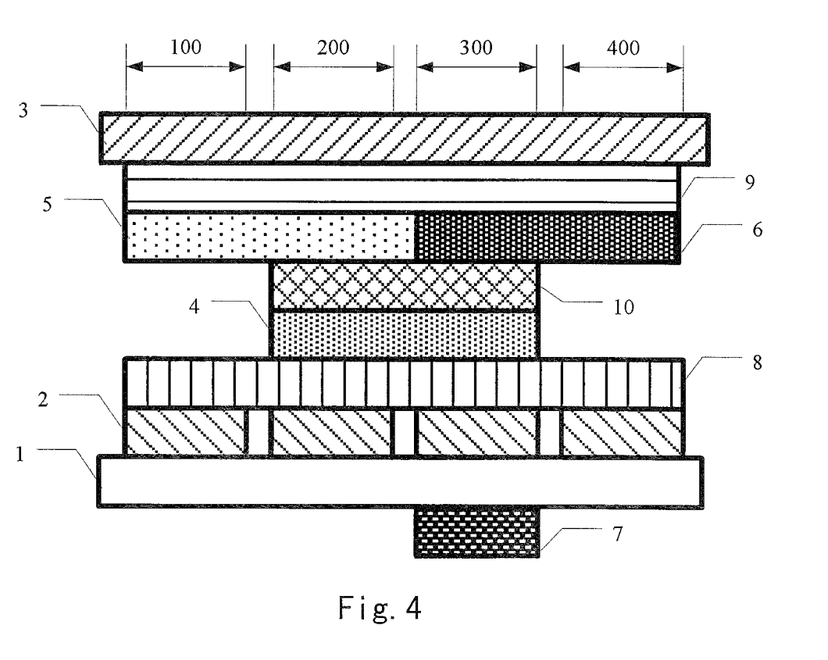
FIG. 4 is a schematic view of an array substrate in accordance with a fourth embodiment of the present invention.

With reference to FIG. 4, it shows a schematic view of the array substrate in accordance with a fourth embodiment of the present invention. This array substrate has substantially the same structure as that of the array substrate as shown in FIG. 1, while the difference lies in that a barrier layer 10 is added between the respective two different light emitting layers in the second light emitting unit 200 and the third light emitting unit 300, and is configured to enable only one light emitting layer in the second light emitting unit 200 and the third light emitting unit 300 to emit light. For example, when the first electrode 2 is the anode and the second electrode 3 is the cathode, the barrier layer 10 can be an electron hole blocking layer. In this case, when a voltage is applied across the first electrode 2 and the second electrode 3, within the second light emitting unit 200 and the third light emitting unit 300, the electron holes in the first electrode 2 are prevented by the barrier layer 10 from entering the second light emitting layer 5 and the third light emitting layer 6, and thus the second light emitting layer 5 and the third light emitting layer 6 do not emit light; while the electrons of the second electrode 3 can pass through the barrier layer 10 and meet the electrons of the first electrode 2 in the first light emitting layer 4 to make it emit light.

In the present embodiment, the barrier layer of the second light emitting unit 200 and the third light emitting unit 300 can be of the same type, preferably, being the same barrier layer (i.e., the common barrier layer). The barrier layer can be the electron blocking layer or electron hole blocking layer, and is configured to make the first light emitting layer 4 emit light in both the second light emitting unit 200 and the third light emitting unit 300. That is, the barrier layer in the second light emitting unit 200 and the third light emitting unit 300 can be formed by the same one patterning process, and in this case the color conversion layer 7 is provided at the light exiting side of the second light emitting unit 200 or the third light emitting unit 300.

In addition, as for the OLED display device, the array substrate includes a plurality of pixel units arranged in a matrix, each of which includes at least one group of the first light emitting unit, the second light emitting unit, the third light emitting unit and the fourth light emitting unit as described above, wherein each light emitting unit can emit different light. In the present embodiment, the first light emitting layer 4, the second light emitting layer 5 and the third light emitting layer 6 can emit different light from each other, and the color conversion layer 7 is used to convert the light emitted from any light emitting layer, so that an OLED display device of four pixel type can be obtained. For example, because the green light and the blue light have the energy higher than that of the red light, it is easier to convert the green light and the blue light into the red light. Therefore, the first light emitting layer 4, the second light emitting layer 5 and the third light emitting layer 6 each can emit the light with any one color of the green, the dark blue and the light blue, and the light emitting colors of the three light emitting layers are different from each other, and the green, the dark blue or the light blue is converted into the red by the color conversion layer 7, so that the OLED display device having the four pixel type of green, dark blue, light blue and red is obtained.

Further, since the light emitting efficiency of the green light emitting material is higher than that of the blue light emitting material, the red light can be obtained by converting the green light. For example, in the array substrate as shown in FIG. 4, the first light emitting layer 4 emits light in the second light emitting unit 200 and the third light emitting unit 300, and the color conversion layer 7 is provided at the light exiting side of the second light emitting unit 200 or the third light emitting unit 300, so that the light emitting color of the first light emitting layer 4 is green, one of the second light emitting layer 5 and the third light emitting layer 6 has a dark blue light emitting color while the other has a light blue light emitting color, and the green light of the first light emitting layer 4 is converted by the color conversion layer 7 into the red light in one light emitting unit.

With the array substrate provided by the present embodiment, the first light emitting layer 4 is provided in the second light emitting unit 200 and the third light emitting unit 300, the second light emitting layer 5 is provided in the first light emitting unit 100 and the second light emitting unit 200, and the third light emitting layer 6 is provided in the third light emitting unit 300 and the fourth light emitting unit 400, so that the same one light emitting layer is manufactured in the two adjacent light emitting units, thereby reducing the precision requirement to the Fine Metal Mask (FMM). For example, in the case that the FMM has the precision of width K, the light emitting layer in the array substrate of the prior art manufactured by it has the width of K. When the array substrate of the present embodiment is manufactured by it or the same FMM, firstly a first light emitting layer 4 having a width of K may be manufactured in the second light emitting unit 200 and the third light emitting unit 300 (each light emitting unit includes a first light emitting layer of width of K/2), secondly a second light emitting layer 5 having a width of K is manufactured within the first light emitting unit 100 and the second light emitting unit 200 (each light emitting unit includes a second light emitting layer of width of K/2), and thirdly a third light emitting layer 6 having a width of K is manufactured within the third light emitting unit 300 and the fourth light emitting unit 400 (each light emitting unit includes a third light emitting layer of width of K/2), so that each produced light emitting unit has smaller width, thereby enhancing the resolution of the OLED display device.

Please be noted that in the drawing, for sake of clarity, the size for a layer and a region is exaggerated. Furthermore, please be understood that when an element or a layer is called as "on" another element or layer, it means that it can directly be located on another element or there might be a middle layer between them. In addition, it should be understood that when the element or layer is called as "below" another element or layer, it means that it can be directly located below another element or there might be at least one middle layer or element. In addition, it also should be understood that when the layer or element is called to be between the two layers or two elements, it means that it can be the only layer between the two layers or the two elements, or there also might be at least one middle layer or element. The similar reference numbers throughout the description indicate the similar elements.

In addition, the present embodiment also provides a display device, including the above array substrate. The display device provided by the present embodiment can be any product or component having a display function such as a display screen of a notebook computer, a liquid crystal display, a liquid crystal television, a digital photo frame, a mobile phone, and a flat panel computer or the like.

Furthermore, an embodiment of the present invention also provides a method for producing the array substrate as described above. The array substrate includes a base substrate 1 and a first light emitting unit 100, a second light emitting unit 200, a third light emitting unit 300 and a fourth light emitting unit 400 formed on the base substrate 1 and arranged periodically thereon. Specifically, the step of forming the first to fourth light emitting units 100, 200, 300, 400 includes:

S1: forming a first electrode 2 at a position of the base substrate 1 corresponding to the first to fourth light emitting units 100, 200, 300, 400;

S2: forming a first light emitting layer 4 at a position of the base substrate 1 formed with the first electrode 2, corresponding to the second light emitting unit 200 and the third light emitting unit 300;

S3: forming a second light emitting layer 5 at a position of the base substrate 1 formed with the first light emitting layer 4, corresponding to the first light emitting unit 100 and the second light emitting unit 200, wherein the part of the second light emitting layer 5 in the second light emitting unit 200 is overlaid on the first light emitting layer 4;

S4: forming a third light emitting layer 6 at a position of the base substrate 1 formed with the second light emitting layer 5, corresponding to the third light emitting unit 300 and the fourth light emitting unit 400, wherein the part of the third light emitting layer 6 in the third light emitting unit 300 is overlaid on the first light emitting layer 4;

S5: forming a second electrode 3 at a position of the base substrate 1 formed with the third light emitting layer 6, corresponding to the first light emitting unit 100, the second light emitting unit 200, the third light emitting unit 300 and the fourth light emitting unit 400.

In addition, the method for producing the array substrate further includes: forming a color conversion layer 7 at the light exiting side within one light emitting unit of the two light emitting units having the same light emitting layer which emits light in the two light emitting units.

Preferably, apart from forming the light emitting layers, the method for producing the array substrate as described above further includes forming an electron function layer 9 and an electron hole function layer 8, wherein the electron function layer 9 includes at least one of an electron transmission layer and an electron injection layer, and the electron hole function layer 8 includes at least one of an electron hole transmission layer and an electron hole injection layer. The electron hole function layer 8 is formed between the anode and the light emitting layer, and the electron function layer 9 is formed between the cathode and the light emitting layer.

Preferably, after forming the first light emitting layer 4 and before forming the second light layer 5, it further includes:

forming a barrier layer 10 at the position where the second light emitting unit 200 and the third light emitting unit 300 are located, wherein the barrier layer 10 is used to prevent the injected electrons or electron holes into one light emitting layer from being injected into the other light emitting layer, within the same one light emitting unit.

The barrier layer 10 in the second light emitting unit 200 and the third light emitting unit 300 can be of the same type, i.e., the electron blocking layer or electron hole blocking layer. The barrier layer 10 is configured to enable the first light emitting layer 4 to emit light in both the second light emitting unit 200 and the third light emitting unit 300. That is, the barrier layer 10 in the second light emitting unit 200 and the third light emitting unit 300 can be formed at the same time by one patterning process. In this case, the step of forming the color conversion layer 7 at the light exiting side includes:

forming the color conversion layer 7 at the light exiting side of the second light emitting unit 200 or the third light emitting unit 300.

For example, when the FMM having a precision of width K is used to manufacture the light emitting layer, firstly, a first light emitting layer 4 having a width K is manufactured in the second light emitting unit 200 and the third light emitting unit 300 (each of them includes the first light emitting layer having a width of K/2), secondly a second light emitting layer 5 having a width K is manufactured in the first light emitting unit 100 and the second light emitting unit 200 (each of them includes the second light emitting layer having a width of K/2); and thirdly a third light emitting layer 6 having a width K is manufactured in the third light emitting unit 300 and the fourth light emitting unit 400 (each of them includes the third light emitting layer having a width of K/2), so that each light emitting unit includes a light emitting layer having a width of K/2. As compared to the prior art, each light emitting unit produced by the present disclosure has smaller width, and thus can improve the resolution of the OLED display device. In addition, as for the color conversion layer 7, when each light emitting layer has a width of K/2, the corresponding width must be K/2. Thus, the manufacturing of the color conversion layer can employ the lithography having higher resolution.

In the method for producing the array substrate provided by the present embodiment, the produced first, second and third light emitting layers 4, 5, 6 can emit different lights from each other by using the different light emitting materials, and the light emitted from any light emitting layer can be converted by the produced color conversion layer 7, so that the OLED display device having four pixel type can be obtained. For example, because the green light and the blue light have the energy higher than that of the red light, it is easier to convert the green light and the blue light into the red light. Therefore, the first light emitting layer 4, the second light emitting layer 5 and the third light emitting layer 6 each can emit the light having any one of the green, the dark blue and the light blue, and the light emitting colors of the three light emitting layers are different from each other, and the green, the dark blue or the light blue is converted into the red by the color conversion layer 7, so that the OLED display device having the four pixel type of green, dark blue, light blue and red is obtained.

Preferably, when the first light emitting layer 4 emits light in the second light emitting unit 200 and the third light emitting unit 300, the color conversion layer 7 is formed at the light exiting side of the second light emitting unit 200 or the third light emitting unit 300. Because the green light emitting material generally has the light emitting efficiency higher than that of the blue light emitting material, it is preferable to make the light emitting color of the first light emitting layer 4 be green, the light emitting color of one of the second light emitting layer 5 and the third light emitting layer 6 is dark blue, and that of the other one is light blue, and the green light of the first light emitting layer 4 is converted into red light by the color conversion layer 7, so that the OLED display device of the four pixel type of green, dark blue, light blue and red having a higher light emitting efficiency is obtained.

The above embodiments are only used to explain the present invention, rather than to make limitation to the present invention. The ordinary skilled person in the relevant technical field can also make various changes and modification, without departing apart from the spirit and scope of the present invention. Therefore, all the equivalent technical solutions also belong to the scope of the present invention, and the scope of the present invention should be defined by the appended claims.

What is claimed is:

1. An array substrate, comprising:
a base substrate; and
a first light emitting unit, a second light emitting unit, a third light emitting unit and a fourth light emitting unit provided on the base substrate and arranged periodically thereon,
wherein each of the first light emitting unit, the second light emitting unit, the third light emitting unit and the fourth light emitting unit comprises a first electrode, a second electrode and an organic material function layer, the organic material function layer comprising a light emitting portion,
wherein the light emitting portion comprises a first light emitting layer in the second light emitting unit and the third light emitting unit, a second light emitting layer in the first light emitting unit and the second light emitting unit, and a third light emitting layer in the third light emitting unit and the fourth light emitting unit, so that the same light emitting layer is produced in two adjacent ones of the first to fourth light emitting units by a fine metal mask, wherein any of the first to third light emitting layers has a same width of K and each of the first to fourth light emitting units has a light emitting layer with a width of K/2,
wherein K is precision of width of the fine metal mask, and
wherein the first light emitting layer is configured to emit light within at least one of the second light emitting unit and the third light emitting unit;
wherein the first light emitting layer extends across the second light emitting unit and the third light emitting unit, and a part of the second light emitting layer in the second light emitting unit is overlaid on the first light emitting layer, and a part of the third light emitting layer in the third light emitting unit is overlaid on the first light emitting layer;
wherein when the second light emitting layer emits light in both the first and second light emitting units, a color conversion layer is provided at a light exiting side of one of the first and second light emitting units; or
wherein when the first light emitting layer emits light in both the second and third light emitting units, a color conversion layer is provided at a light exiting side of one of the second and third light emitting units; or
wherein when the third light emitting layer emits light in both the third and fourth light emitting units, a color conversion layer is provided at a light exiting side of one of the third and fourth light emitting units.

2. The array substrate as claimed in claim 1, wherein the second light emitting layer and the third light emitting layer are provided to contact with each other at a boundary between the second light emitting unit and the third light emitting unit.

3. The array substrate as claimed in claim 2, wherein all the first light emitting layer, the second light emitting layer and the third light emitting layer have a first width,
a width of the first light emitting layer in the second light emitting unit and the third light emitting unit is a second width, a width of the second light emitting layer in the first light emitting unit and the second light emitting unit is the second width, and a width of the third light emitting layer in the third light emitting unit and the fourth light emitting unit is the second width, wherein the second width is a half of the first width.

4. The array substrate as claimed in claim 1, wherein the second light emitting unit is configured to make only one of the first light emitting layer and the second light emitting layer located therein emit light, and the third light emitting unit is configured to make only one of the first light emitting layer and the third light emitting layer located therein emit light.

5. The array substrate as claimed in claim 4, wherein
the only one of the first light emitting layer and the second light emitting layer is made to emit light by controlling carrier transmission characteristics of the first light emitting layer and the second light emitting layer in the second light emitting unit and/or relationship of energy level between them;
the only one of the first light emitting layer and the third light emitting layer is made to emit light by controlling carrier transmission characteristics of the first light emitting layer and the third light emitting layer in the third light emitting unit and/or relationship of energy level between them.

6. The array substrate as claimed in claim 5, wherein
the carrier transmission characteristics of the second light emitting layer and the third light emitting layer are configured to be beneficial to electron hole transmission, so that only the first light emitting layer in the second light emitting unit and the third light emitting unit emits light.

7. The array substrate as claimed in claim 5, wherein
when the first electrode is a cathode and the second electrode is an anode, HOMO of the second light emitting layer and the third light emitting layer is controlled to be identical with or very close to that of the first light emitting layer, and LUMO of the second light emitting layer and the third light emitting layer is controlled to have large difference from that of the first light emitting layer, so that only the first light emitting layer in the second light emitting unit and the third light emitting unit emits light.

8. The array substrate as claimed in claim 4, wherein
the second light emitting unit also comprises a barrier layer between the first light emitting layer and the second light emitting layer, which is configured in the second light emitting unit to prevent electrons or electron holes injected into one of the first and second light emitting layers from being injected into the other one; and/or
the third light emitting unit also comprises a barrier layer between the first light emitting layer and the third light emitting layer, which is configured in the third light emitting unit to prevent electrons or electron holes injected into one of the first and third light emitting layers from being injected into the other one.

9. The array substrate as claimed in claim 8, wherein
the barrier layer in the second and third light emitting units is a common barrier layer.

10. The array substrate as claimed in claim 9, wherein
the common barrier layer is configured to enable the first light emitting layer to emit light in both the second light emitting unit and the third light emitting unit, and a color conversion layer is provided at a light exiting side of the second light emitting unit or the third light emitting unit.

11. The array substrate as claimed in claim 10, wherein
the light emitting colors of the first, second and third light emitting layers each are any one of green, dark blue and light blue, and they are different from each other, and the color conversion layer is used to convert the green, dark blue or light blue into red.

12. The array substrate as claimed in claim 11, wherein
the light emitting color of the first light emitting layer is green, the light emitting color of one of the second light emitting layer and the third light emitting layer is dark blue and that of the other is light blue.

13. The array substrate as claimed in claim 1, wherein
one of the first electrode and the second electrode is an anode, while the other one is a cathode.

14. The array substrate as claimed in claim 13, wherein
the organic material function layer further comprises an electron hole function layer between the corresponding light emitting layer and the anode and an electron function layer between the corresponding light emitting layer and the cathode.

15. The array substrate as claimed in claim 13, wherein
at least one of the first electrode and the second electrode is a transparent electrode, and the color conversion layer is provided at a side of the transparent electrode or the base substrate away from the corresponding light emitting layer.

16. The array substrate as claimed in claim 15, wherein
one of the first and second electrodes is provided to be in a form of a plurality of electrodes separated from each other, and the other one is provided to be a common electrode.

17. A display device, comprising an array substrate according to claim 1.

18. A method for producing the array substrate according to claim 1, comprising the following of:
forming the first electrode at a position of the base substrate corresponding to the first to fourth light emitting units;
forming the first light emitting layer at a position of the base substrate formed with the first electrode, corresponding to the second light emitting unit and the third light emitting unit;
forming the second light emitting layer at a position of the base substrate formed with the first light emitting layer, corresponding to the first light emitting unit and the second light emitting unit, wherein a part of the second light emitting layer in the second light emitting unit is overlaid on the first light emitting layer;
forming the third light emitting layer at a position of the base substrate formed with the second light emitting layer, corresponding to the third light emitting unit and the fourth light emitting unit, wherein a part of the third light emitting layer in the third light emitting unit is overlaid on the first light emitting layer;
forming the second electrode at a position of the base substrate formed with the third light emitting layer, corresponding to the first to fourth light emitting units.

* * * * *